United States Patent
Hsieh et al.

(10) Patent No.: US 9,017,763 B2
(45) Date of Patent: Apr. 28, 2015

(54) INJECTOR FOR FORMING FILMS RESPECTIVELY ON A STACK OF WAFERS

(71) Applicant: Taiwan Semiconductor Manufacturing Company, Ltd., Hsinchu (TW)

(72) Inventors: Wei-Che Hsieh, New Taipei (TW); Brian Wang, Hsinchu (TW); Tze-Liang Lee, Hsinchu (TW); Yi-Hung Lin, Taipei (TW); Hao-Ming Lien, Hsinchu (TW); Shiang-Rung Tsai, Hsinchu (TW); Tai-Chun Huang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 13/716,052

(22) Filed: Dec. 14, 2012

(65) Prior Publication Data

US 2014/0170319 A1 Jun. 19, 2014

(51) Int. Cl.
*B05B 1/14* (2006.01)
*H01L 21/00* (2006.01)

(52) U.S. Cl.
CPC ..................................... *H01L 21/00* (2013.01)

(58) Field of Classification Search
None
See application file for complete search history.

(56) References Cited

U.S. PATENT DOCUMENTS

| | | | |
|---|---|---|---|
| 4,992,301 A * | 2/1991 | Shishiguchi et al. | 118/724 |
| 2003/0049372 A1 * | 3/2003 | Cook et al. | 427/248.1 |
| 2006/0185591 A1 * | 8/2006 | Muralidharan et al. | 427/248.1 |

FOREIGN PATENT DOCUMENTS

KR 2005093229 A * 9/2005

* cited by examiner

*Primary Examiner* — Mandy Louie
(74) *Attorney, Agent, or Firm* — McDermott Will & Emery LLP

(57) ABSTRACT

An injector for forming films respectively on a stack of wafers is provided. The injector includes a plurality of hole structures. Every adjacent two of the wafers have therebetween a wafer spacing, and each of the wafers has a working surface. The hole structures respectively correspond to the respective wafer spacings. The working surface and a respective hole structure have therebetween a parallel distance. The parallel distance is larger than a half of the wafer spacing. A wafer processing apparatus and a method for forming films respectively on a stack of wafers are also provided.

5 Claims, 11 Drawing Sheets

INJECTOR FOR FORMING FILMS RESPECTIVELY ON A STACK OF WAFERS

FIELD

The present disclosure is related to an injector, and more particularly to an injector for forming films respectively on a stack of wafers.

BACKGROUND

The atomic layer deposition (ALD) has been proposed as an alternative to the CVD-based deposition method for the formation of a silicon nitride film or a silicon oxide film, such as an $Si_3N_4$ film or an $SiO_2$ film. The ALD is a surface controlled process conducted in a surface kinetic manner, which results in the two-dimensional layer-by-layer deposition on the wafer surface. The precursors of silicon nitride, such as the DCS (dichlorosilane, $SiH_2Cl_2$) gas and ammonia ($NH_3$) gas, flow into a tube for forming the silicon nitride film.

The deposition of the silicon nitride film according to the ALD process is preformed by repeating a cycle until a desired film thickness is obtained. The cycle includes the following steps. Firstly, a deposition gas, which contains the DCS gas as a silicon source, is supplied to a processing vessel such that the silicon source can be adsorbed by the wafer surface. Secondly, the nitrogen gas is supplied to drive out the DCS gas. Thirdly, a nitride gas, which contains the ammonia gas radicalized by the plasma, is supplied to the processing vessel such that the adsorbed DCS can be decomposed and nitrified. Fourthly, the nitrogen gas is supplied to drive out the ammonia gas. However, the above-mentioned steps will result in a delivery problem due to the very low vapor pressure of the precursors as well as a pattern loading effect. There is a need to solve the above problems.

SUMMARY

In accordance with one aspect of the present disclosure, an injector for forming films respectively on a stack of wafers is provided. Every adjacent two of the wafers have therebetween a wafer spacing, and each of the wafers has a working surface. The injector includes a plurality of hole structures respectively corresponding to the respective wafer spacings. The working surface and a respective hole structure have therebetween a parallel distance. The parallel distance is larger than a half of the wafer spacing.

DETAILED DESCRIPTION OF THE PREFERRED EMBODIMENT

Figure 1:
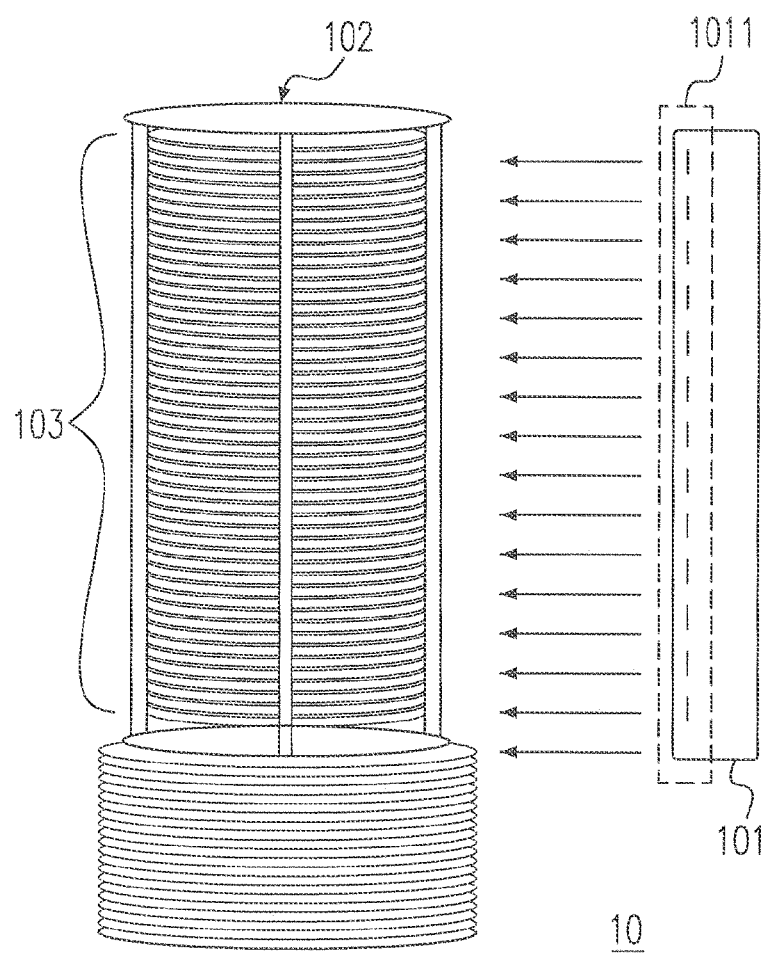
FIG. 1 shows a wafer processing apparatus according to various embodiments of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn to scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to a device consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or methods may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The invention will now be described by a detailed description of several embodiments. It is clear that other embodiments can be configured according to the knowledge of persons skilled in the art without departing from the true technical teaching of the present disclosure, the claimed invention being limited only by the terms of the appended claims.

Figure 2:
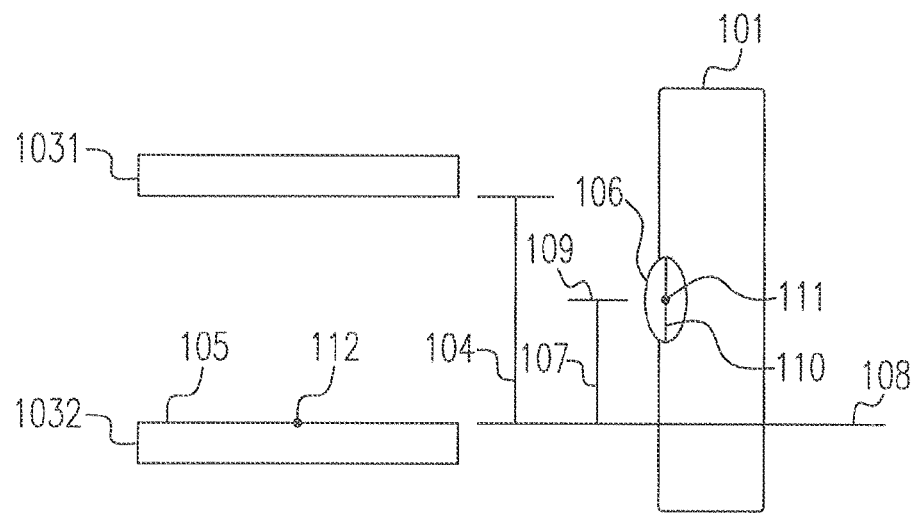
FIG. 2 shows a wafer spacing between two adjacent wafers and a hole structure according to various embodiments of the present disclosure.

Please refer to FIGS. 1 and 2. FIG. 1 shows a wafer processing apparatus 10 according to various embodiments of the present disclosure. FIG. 2 shows a wafer spacing 104 between two adjacent wafers 1031, 1032 and a hole structure 106 according to various embodiments of the present disclosure. The wafer processing apparatus 10 includes an injector 101 and a wafer supporting device 102. The wafer supporting device 102 supports a stack of wafers 103, every adjacent two of which have therebetween a wafer spacing 104, and each of which has a working surface 105. The injector 101 includes a plurality of hole structures 1011 respectively corresponding to the respective wafer spacings 104. The working surface 105 and a respective hole structure 106 have therebetween a parallel distance 107. The parallel distance 107 is larger than a half of the wafer spacing 104.

The parallel distance 107 is a vertical distance, which is also a hole height defined by a distance between a first extended horizontal line 108 of the working surface 105 and a second extended horizontal line 109 of the center 111 of the hole structure 106.

The wafer supporting device 102 includes a rotation device (not shown) disposed at a center axis thereof, and can be rotated by the rotation device at a predetermined speed during the deposition process, so that a working material can be deposited onto the working surface 105 uniformly. For example, the working material can be the DCS gas or ammonia gas. Due to the uneven surface resulting from the lithography pattern definition, the pattern loading effect exits. Even if the parallel distance 107 is equal to a half of the wafer spacing 104, the pattern loading effect is not improved enough, especially around the center 112 of the working surface 105.

In some embodiments, the working surface 105 is an upper surface of the wafer 1032, the wafer spacing 104 is 8 mm, the hole height is 6 mm, and a diameter 110 of the hole structure 106 is smaller than the wafer spacing 104. When the hole height is larger than a half of the wafer spacing 104, the DCS gas can reach more far away from the hole structure 106 so that the wafer 1032 can adsorb more DCS around the center 112 of the working surface 105.

Figure 3:
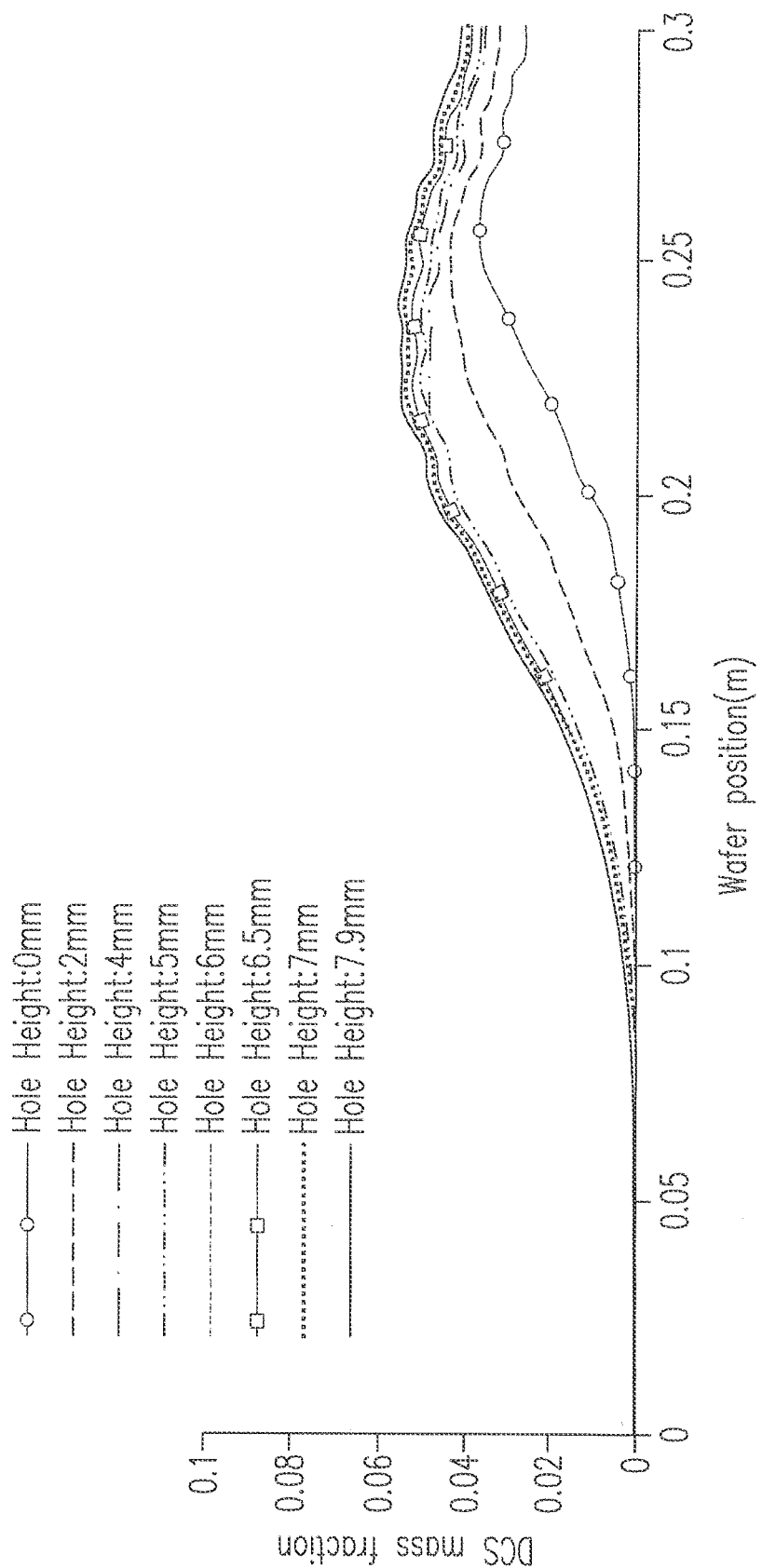
FIG. 3 shows the DCS mass fraction depending on the hole height.

Please refer to FIG. 3, which shows the DCS mass fraction depending on the hole height. The horizontal axis represents the wafer position, and the perpendicular axis represents the DCS mass fraction. The wafer position of 0.15 meter represents a position right at the wafer center, the wafer position of 0 meter represents a position at the wafer edge, and the wafer diameter is 0.3 meter. The direction of the DCS gas is from the wafer position of 0.3 meter to the wafer position of 0 meter. In FIG. 3, the wafer spacing 104 is 8 mm. When the hole height is increased from 0 to 7.9 mm, the DCS mass fraction is also increased. However, when the hole height is larger than 6 mm, i.e. larger than ¾ of the wafer spacing 104, the DCS mass fraction approaches saturated. FIG. 3 shows an improvement for the DCS mass fraction when the hole height is larger than a half of the wafer spacing 104, wherein the improvement for the DCS mass fraction is better when the hole height is larger than ¾ of the wafer spacing 104.

In some embodiments, the wafer spacing 104 is enlarged from 8 mm to 16 mm. Enlarging the wafer spacing 104 can let the DCS gas reach more far away from the hole structure 106 so that the wafer 1032 can adsorb more DCS near the center 112 of the working surface 105.

Figure 4:
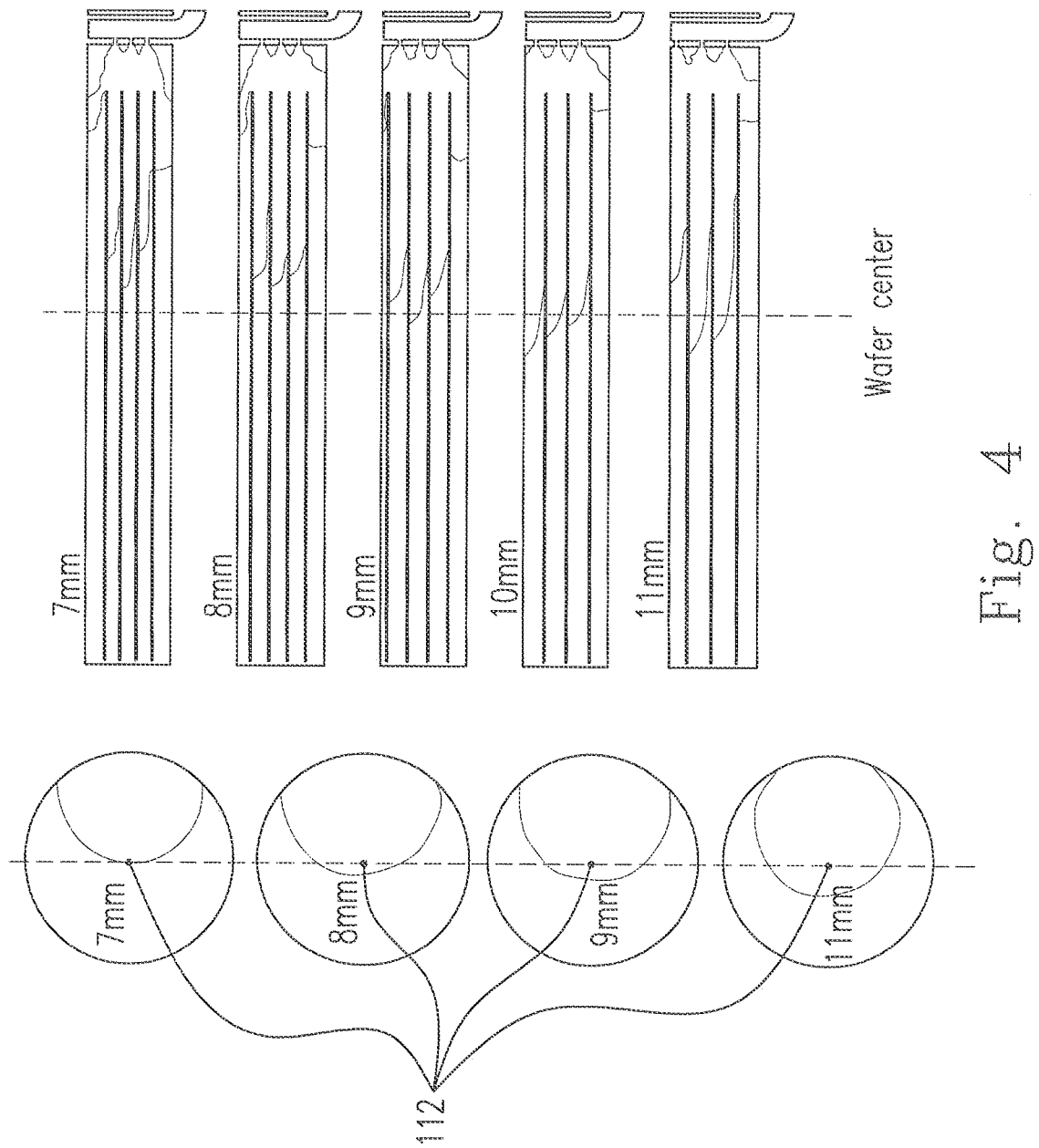
FIG. 4 shows the DCS adsorption on the working surface of the wafer in a top view and in a side view respectively.

Please refer to FIG. 4, which shows the DCS adsorption on the working surface 105 of the wafer 1032 in a top view and in a side view respectively. The adsorption rate depends on the wafer spacing 104. In the top view and the side view of the DCS adsorption, it shows that the larger the wafer spacing 104 is, the farther the DCS gas can reach. Although enlarging the wafer spacing 104 can increase the DCS adsorption near the center 112 of the working surface 105, the WPH (wafer per hour) is sacrificed. For example, enlarging the wafer spacing 104 from 8 mm to 11 mm reduces 25% WPH, i.e. causing the amount of the wafer products to be reduced from 100 pieces to 75 pieces.

In some embodiments, the wafer spacing 104 is enlarged, and the parallel distance 107 is larger than a half of the wafer spacing 104.

Figure 5:
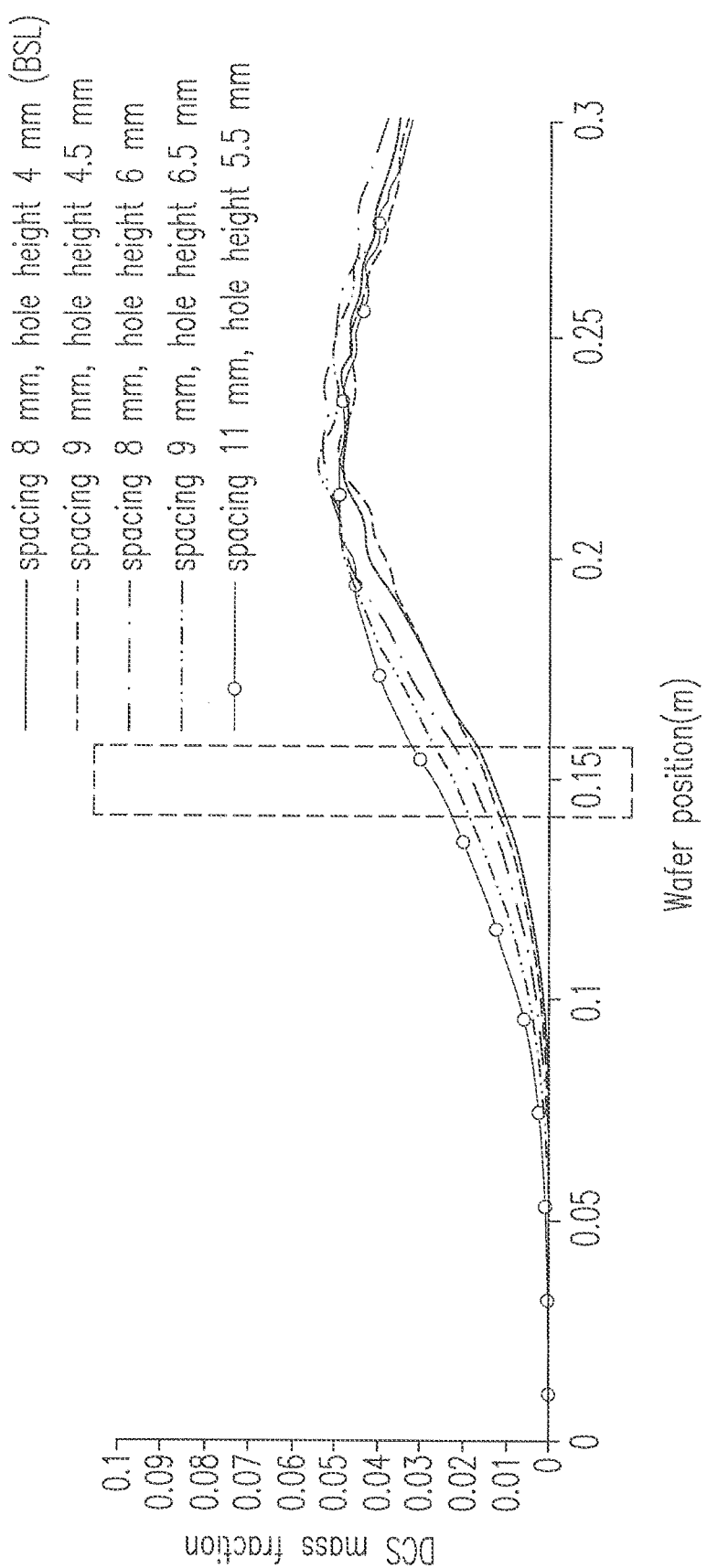
FIG. 5 shows the DCS mass fraction depending on the hole height and the wafer spacing.

Please refer to FIG. 5, which shows the DCS mass fraction depending on the hole height and the wafer spacing 104. The horizontal axis represents a wafer position, and the perpendicular axis represents the DCS mass fraction. The wafer position of 0.15 meter represents a position right at the wafer center, the wafer position of 0 meter represents a position at the wafer edge, and the wafer diameter is 0.3 meter. The direction of the DCS gas is from the wafer position of 0.3 meter to the wafer position of 0 meter. In FIG. 5, both of the hole height and the wafer spacing 104 can be changed, and the base line is corresponding to the condition that the wafer spacing 104 is 8 mm and the hole height is 4 mm. The wafer center is chosen for comparing the adsorption rates with different hole heights and wafer spacings 104.

Figure 6:
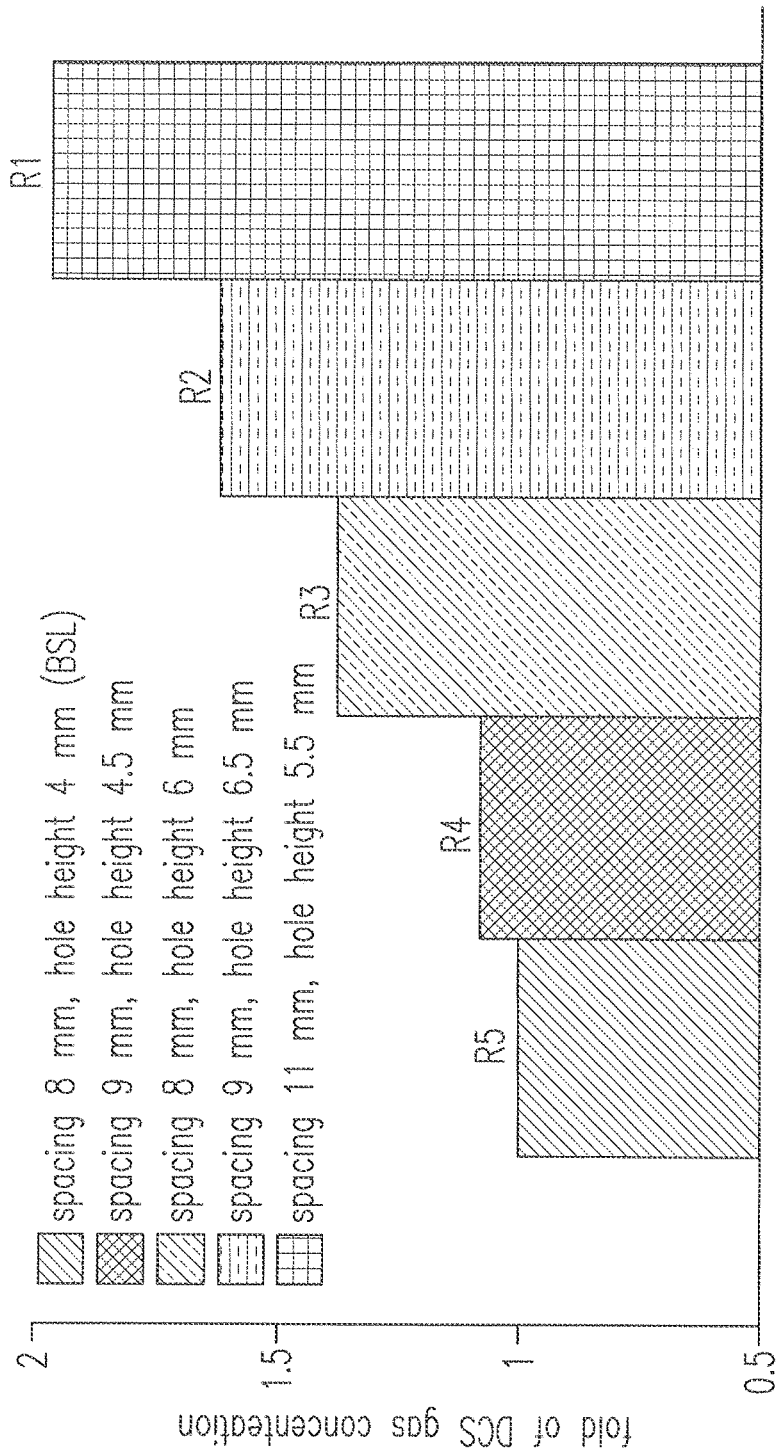
FIG. 6 is a bar chart showing the folds of DCS gas concentrations at the wafer center position according to the different parameters of the wafer spacing and the hole height.

FIG. 6 is a bar chart showing the folds of DCS gas concentrations at the wafer position near 0.15 meter according to the different parameters of the wafer spacing and the hole height. The perpendicular axis represents the fold of DCS gas concentration on the working surface 105 according to the base line. The respective adsorption rates near the wafer position of 0.15 meter are as follows. The adsorption rate R1 is larger than the adsorption rate R2, the adsorption rate R2 is larger than the adsorption rate R3, the adsorption rate R3 is larger than the adsorption rate R4, and the adsorption rate R4 is larger than the adsorption rate R5. The adsorption rate R1 is corresponding to the condition that the wafer spacing 104 is 11 mm and the hole height is 5.5 mm. The adsorption rate R2 is corresponding to the condition that the wafer spacing 104 is 9 mm and the hole height is 6.5 mm. The adsorption rate R3 is corresponding to the condition that the wafer spacing 104 is 8 mm and the hole height is 6 mm. The adsorption rate R4 is corresponding to the condition that the wafer spacing 104 is 9 mm and the hole height is 4.5 mm. The adsorption rate R5 is corresponding to the condition that the wafer spacing 104 is 8 mm and the hole height is 4 mm.

FIG. 6 shows that the best result is the condition that the wafer spacing 104 is 11 mm and the hole height is 5.5 mm. However, if the wafer spacing 104 is 11 mm, the WPH is reduced by 25%, i.e. the wafer yield is reduced from 100 pieces to 75 pieces, compared with the wafer spacing 104 of 8 mm. In order to maintain the WPH and improve the adsorption rate simultaneously, the condition that the hole height is larger than or equal to ¾ of the wafer spacing 104 can be chosen. For example, the condition that the wafer spacing 104 is 9 mm and the hole height is 6.5 mm, or the condition that the wafer spacing 104 is 8 mm and the hole height is 6 mm can be chosen.

In some embodiments, the respective wafer spacings 104 and the respective parallel distances 107 are uniform. In other embodiments, the respective wafer spacings 104 and the respective parallel distances 107 can be different.

Figure 7:
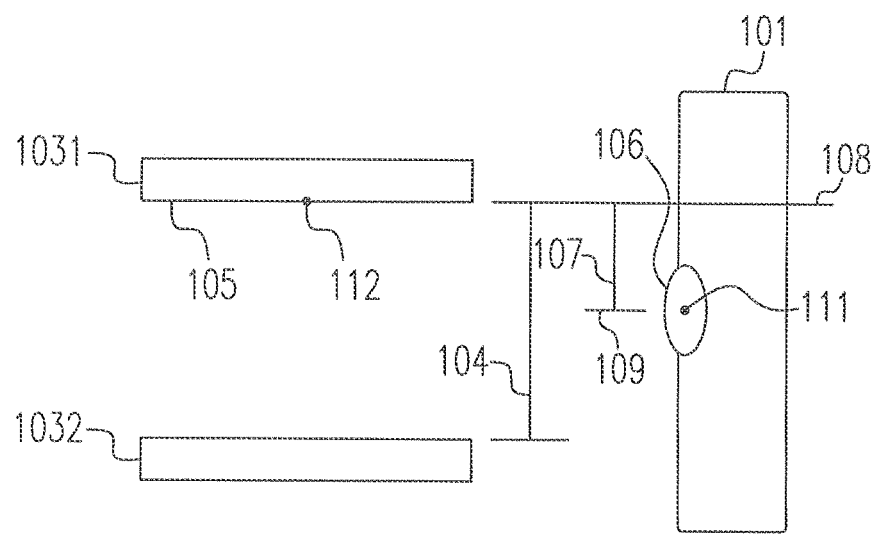
FIG. 7 shows a wafer spacing between two adjacent wafers and a hole structure according to various embodiments of the present disclosure.

Please refer to FIG. 7, which shows a wafer spacing 104 between two adjacent wafers 1031, 1032 and a hole structure 106 according to various embodiments of the present disclosure. As shown in FIG. 7, the wafer 1031 has a working surface 105. The working surface 105 is a lower surface of the wafer 1031. The working surface 105 can have a pattern (not shown) defined by lithography. An injector 101 includes a plurality of hole structures 106 respectively corresponding to the respective wafer spacings 104. The working surface 105 and a respective hole structure 106 have therebetween a parallel distance 107. The parallel distance 107 is larger than a half of the wafer spacing 104. The parallel distance 107 is a vertical distance, which is also a hole height defined by a distance between a first extended horizontal line 108 of the working surface 105 and a second extended horizontal line 109 of the center 111 of the hole structure 106.

Figure 8:
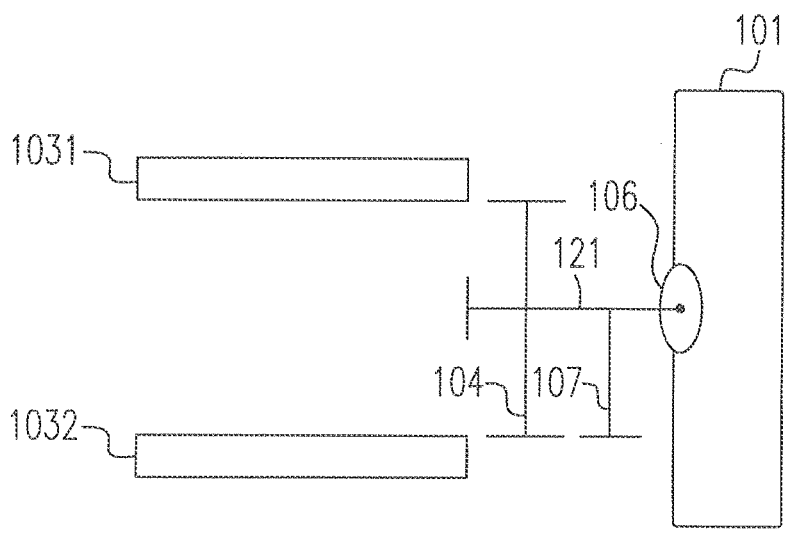
FIG. 8 shows the hole structure-to-wafer distance.
Figure 9:
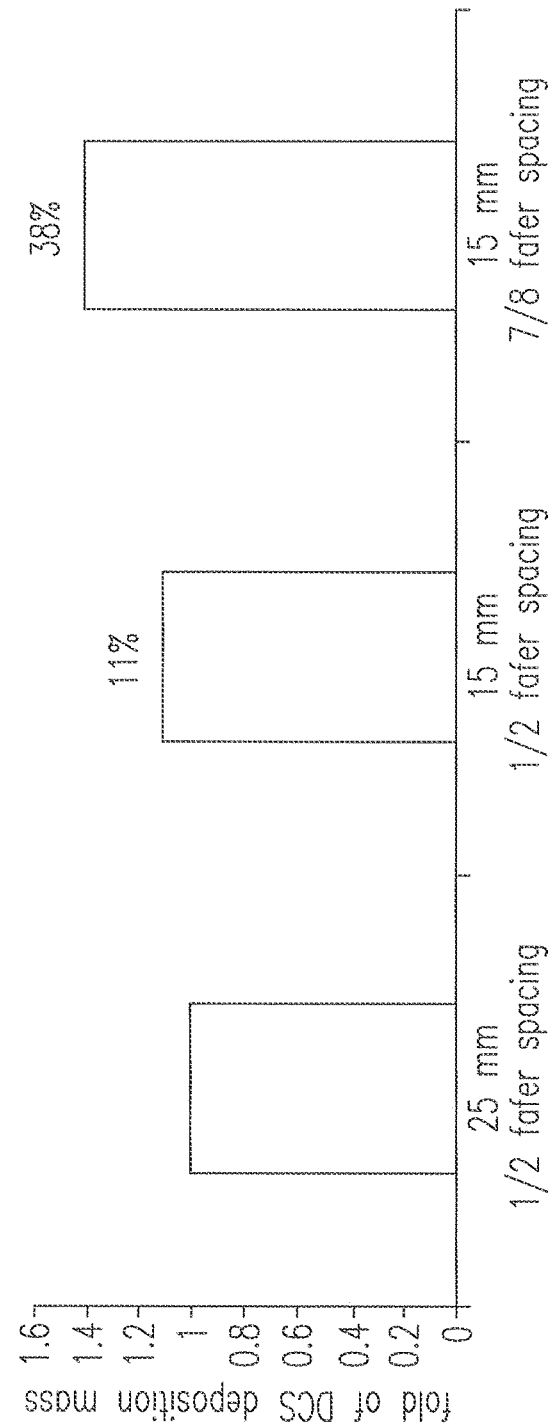
FIG. 9 shows the improvement of the DCS deposition.

In some embodiments, the injector 101 can be disposed closer to the wafer supporting device 102 for better improving the DCS deposition. In other embodiments, the injector 101 can be disposed closer to the wafer supporting device 102 with the hole height being lager than a half of the wafer spacing 104. Please refer to FIGS. 8 and 9. FIG. 8 shows the hole structure-to-wafer distance 121, and FIG. 9 shows the improvement of the DCS deposition. As shown in FIG. 9, the perpendicular axis represents the folds of DCS deposition mass according to the different parameters of the hole structure-to-wafer distance 121 and the hole height. The base line is corresponding to the condition that the hole height is equal to a half of the wafer spacing 104 and the hole structure-to-wafer distance 121 is 25 mm. When the hole height is equal to a half of the wafer spacing 104 and the hole structure-to-wafer distance 121 is shortened from 25 mm to 15 mm, the normalized DCS deposition mass is enhanced by 11% compared with the base line. Due to the safety reason, the injector 102 cannot be disposed too close to the wafer supporting device 102 or the stack of wafers 103. When the hole height is equal to ⅞ of the wafer spacing 104 and the hole structure-to-wafer distance 121 is shortened from 25 mm to 15 mm, the normalized DCS deposition mass is enhanced by 38% compared with the base line. Based on the above, the normalized DCS deposition is enhanced when the hole structure-to-wafer distance 121 is shortened, and is enhanced better when the hole structure-to-wafer distance 121 is shortened with the hole height being enlarged. No matter what the hole structure-to-wafer distance 121 is, the hole height can be varied to further improve the DCS deposition.

Figure 10:
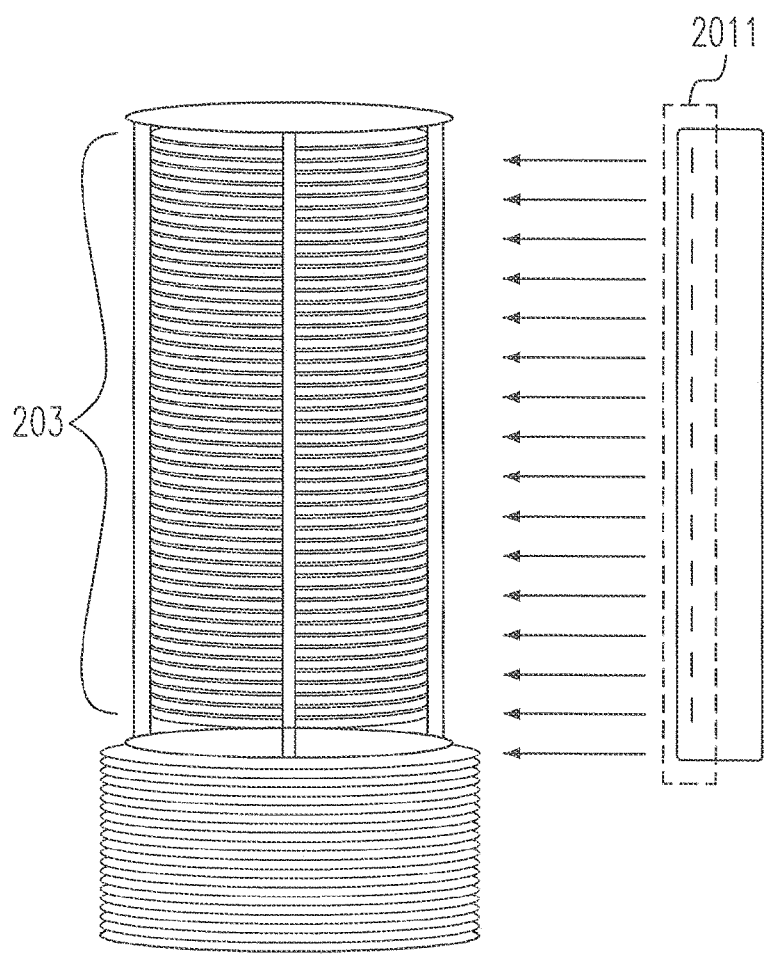
FIG. 10 shows a stack of wafers supplied by the DCS gas from a plurality of holes.
Figure 11:
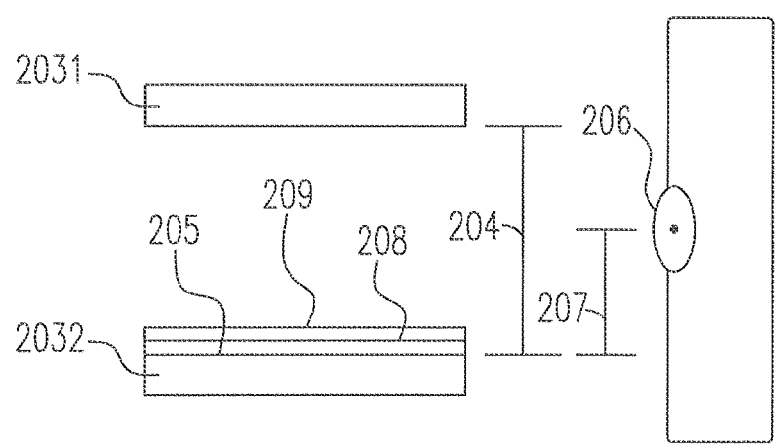
FIG. 11 shows a working surface, a wafer spacing, and a parallel distance between the working surface and a respective hole.

Please refer to FIGS. 10 and 11 FIG. 10 shows a stack of wafers 203 supplied by the DCS gas from a plurality of holes 2011, and FIG. 11 shows a working surface 205, a wafer spacing 204 between two wafers 2031, 2032, and a parallel distance 207 between the working surface 205 and a respective hole 206.

Figure 12:
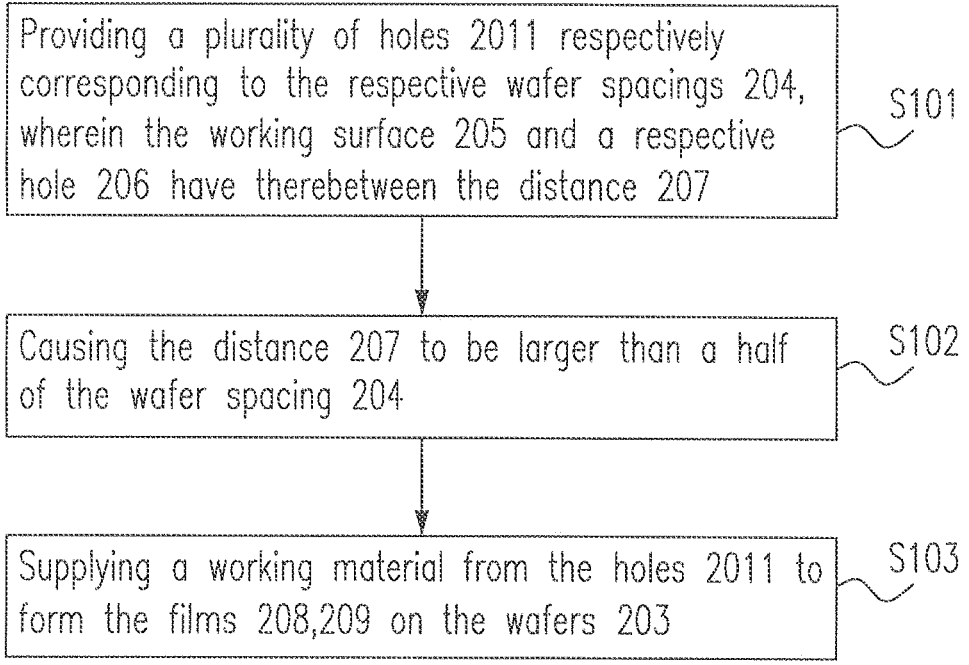
FIG. 12 shows a flow chart of a method for forming films respectively on a stack of wafers.

Please refer to FIGS. 10, 11 and 12 simultaneously. FIG. 12 shows a flow chart of a method for forming films respectively on a stack of wafers 203. Every adjacent two of the wafers 203 have therebetween the wafer spacing 204, and each of the wafers 203 has the working surface 205. The method includes the following steps. Firstly, a plurality of holes 2011 respectively corresponding to the respective wafer spacings 204 are provided, wherein the working surface 205 and a respective hole 206 have therebetween the distance 207 (S101). Secondly, the distance 207 is caused to be larger than a half of the wafer spacing 204 (S102). Thirdly, a working material is supplied from the holes 2011 to form the films 208, 209 on the wafers 203.

In some embodiments, the films 208, 209 can be formed by spraying the working material in different cycles. For example, the holes 2011 spray the DCS gas first, and then spray the ammonia gas to form the film 208 in a first cycle. In a second cycle, the holes 2011 spray the DCS gas first, and then spray the ammonia gas to form the film 209. The films 208, 209 can be silicon nitride films or silicon oxide films. In some embodiments, the films 208, 209 depend on the working material, e.g. the TiN or poly-silicon.

In some embodiments, the method for forming films respectively on a stack of wafers 203 further comprises a step of enlarging the respective wafer spacing 204 to enable the working material to reach more far away from the respective hole 206. The stack of wafers 203 is rotatable along a center axis thereof. The distance 207 is a parallel distance between the working surface 205 and the respective hole 206. A ratio of the distance 207 to the wafer spacing 204 is ranged between 0.5 and 1.

Figure 13:
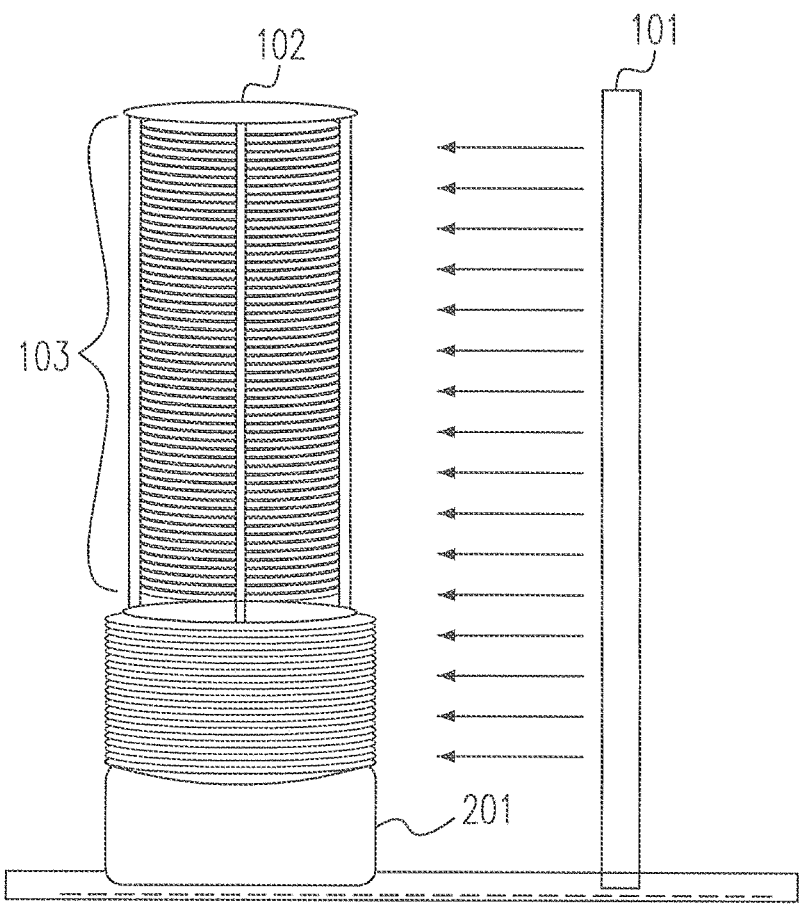
FIG. 13 shows a wafer processing apparatus.
Figure 14:
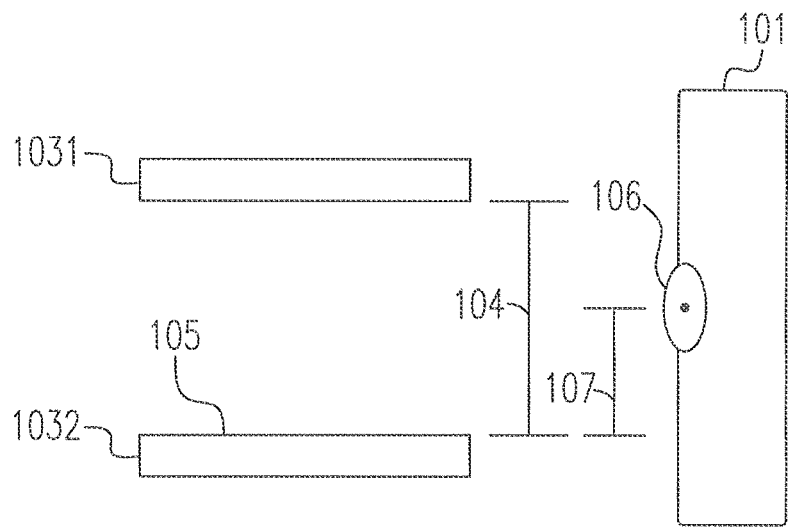
FIG. 14 shows a wafer spacing between two adjacent wafers and a hole structure according to various embodiments of the present disclosure.

Please refer to FIGS. 13 and 14. FIG. 13 shows a wafer processing apparatus 20, and FIG. 14 shows a wafer spacing 104 between two adjacent wafers 1031, 1032 and a hole structure 106 according to various embodiments of the present disclosure. The wafer processing apparatus 20 includes a wafer supporting device 102, an injector 101, and an adjusting device 201. The wafer supporting device 102 supports a stack of wafers 103. The two adjacent wafers 1031, 1032 have therebetween the wafer spacing 104, and the wafer 1032 has the working surface 105. The injector 101 includes the hole structure 106. The working surface 105 and the hole structure 106 have therebetween a parallel distance 107. The adjusting device 201 adjusts the position of the wafer supporting device 102 for causing the parallel distance 107 to be larger than a half of the wafer spacing 104.

Figure 15:
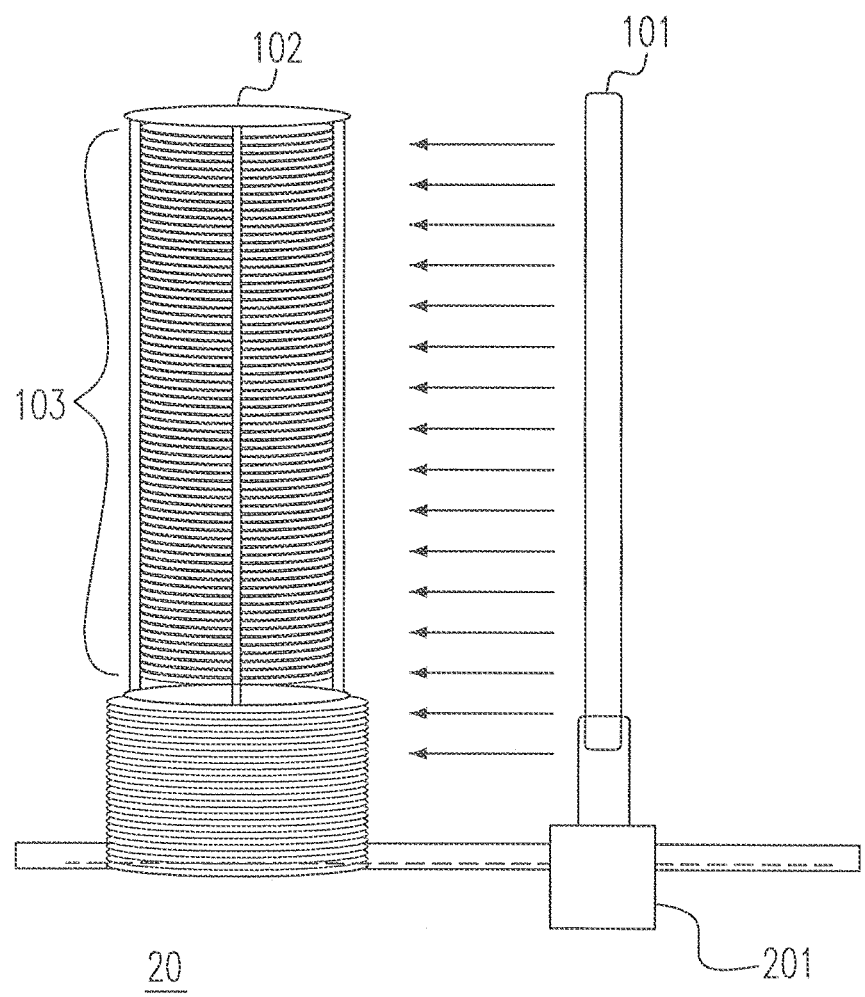
FIG. 15 shows the adjusting device disposed at the bottom of the injector.

The adjusting device 201 is disposed at the bottom of the wafer supporting device 102. In some embodiments, the adjusting device 201 can be disposed at the bottom of the injector 101 and adjust the position of the injector 101 for causing the parallel distance 107 to be larger than a half of the wafer spacing 104, as shown in FIG. 15. In other embodiments, a new injector (not shown) can be built on which the hole height is lager than a half of the wafer spacing 104. In some embodiments, the adjusting device 201 can be a step motor. In other embodiments, the adjusting device 201 can be any kinds of aligners capable of moving the hole structure 106 of the injector 101 higher or lower to a proper position, for causing the parallel distance 107 to be larger than a half of the wafer spacing 104.

EMBODIMENTS

1. A wafer processing apparatus includes a wafer supporting device, an injector, and an adjusting device. The wafer supporting device supports a stack of wafers having a wafer spacing and a working surface. The injector includes a hole structure. The working surface and the hole structure have therebetween a parallel distance. The adjusting device adjusts a position of one of the wafer supporting device and the injector for causing the parallel distance to be larger than a half of the wafer spacing.

2. In the wafer apparatus according to Embodiment 1, a ratio of the parallel distance to the wafer spacing is ranged between 0.5 and 1.

3. In the wafer apparatus according to Embodiments 1-2, the adjusting device is a step motor disposed at a bottom of the wafer supporting device or the injector.

4. In the wafer apparatus according to Embodiments 1-3, the working surface is an upper surface or a lower surface of the wafer, and the parallel distance is a vertical distance.

5. In the wafer apparatus according to Embodiments 1-4, the injector supplies a working material horizontally.

6. A method for forming films respectively on a stack of wafers, every adjacent two of the wafers have therebetween a wafer spacing, and each of the wafers has a working surface, and the method includes steps of providing a plurality of holes respectively corresponding to the respective wafer spacings, causing the distance to be larger than a half of the wafer spacing, and supplying a working material from the holes. The working surface and a respective hole have therebetween a distance. When the working material is supplied from the holes, the films are formed on the wafers.

7. In the method according to Embodiment 6, there are further providing with a step of enlarging the respective wafer spacing. When the respective wafer spacing is enlarged, the working material is enabled to reach more far away from the respective hole.

8. In the method according to Embodiments 6-7, a ratio of the distance to the wafer spacing is ranged between 0.5 and 1.

9. In the method according to Embodiments 6-8, the distance is a parallel distance between the working surface and the respective hole.

10. In the method according to Embodiments 6-9, the stack of wafers is rotatable along a center axis thereof.

11. An injector for forming films respectively on a stack of wafers includes a plurality of hole structures. Every adjacent two of the wafers have therebetween a wafer spacing, and each of the wafers has a working surface. The hole structures respectively correspond to the respective wafer spacings. The working surface and a respective hole structure have therebetween a parallel distance. The parallel distance is larger than a half of the wafer spacing.

12. In the injector according to Embodiment 11, there is further including a boat. The boat has a plurality of slots for placing the stack of wafers horizontally.

13. In the injector according to Embodiments 11-12, all the respective wafer spacings are uniform in depth.

14. In the injector according to Embodiments 11-13, the films are silicon nitride films.

15. In the injector according to Embodiments 11-14, each of the hole structures has a diameter smaller than the wafer spacing.

16. In the injector according to Embodiments 11-15, the parallel distance is larger than $3/4$ of the wafer spacing.

17. In the injector according to Embodiments 11-16, the working surface is an upper surface or a lower surface of a respective one of the wafers.

18. In the injector according to Embodiments 11-17, each of the wafers has an adsorption rate around a center thereof.

19. In the injector according to Embodiments 11-18, the adsorption rate depends on a ratio of the parallel distance to the wafer spacing.

20. In the injector according to Embodiments 11-19, the adsorption rate depends on the wafer spacing.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for forming films respectively on a stack of wafers, every adjacent two wafers in the stack of wafers having therebetween a respective wafer spacing, each wafer in the stack of wafers having a top working surface and a bottom working surface, the method comprising:
   providing an injector having a respective hole, an adjusting device, a respective first wafer having a first top working surface, and a respective second wafer having a second bottom working surface, wherein:
      the respective hole has a center and corresponds to the respective wafer spacing,
      a first axis extends along the first top working surface and a second axis extends from the center of the respective hole and parallel with the first axis, and the first and the second axes have a distance therebetween;
   adjusting a vertical position of the respective hole by the adjusting device to cause the distance to be larger than one half of the wafer spacing, wherein a ratio of the distance to the wafer spacing is larger than or equal to $3/4$ and less than 1; and
   supplying a working material from the respective hole to form the films on the first top working surface and the second bottom working surface.

2. The method of claim 1, further comprising a step of:
   enlarging the respective wafer spacing to enable the working material to reach farther away from the respective hole.

3. The method of claim 1, wherein the films includes at least one of a silicon nitride and silicon oxide.

4. The method of claim 1, wherein the stack of wafers is rotatable along a center axis thereof.

5. A method for forming films respectively on a stack of wafers, wherein every adjacent two wafers in the stack of wafers have therebetween a respective wafer spacing, each wafer in the stack of wafers has a top working surface and a bottom working surface, and the method comprises:
   providing an injector having a respective hole, an adjusting device, a respective first wafer having a first top working surface, and a respective second wafer having a second bottom working surface, wherein:
      the respective hole has a center and corresponds to the respective wafer spacing; and
      a first axis extends along the first top working surface and a second axis extends from the center of the respective hole and parallel with the first axis, and the first and the second axes have a distance therebetween;

adjusting a vertical position of the respective hole by the adjusting device to cause the distance to be larger than one half of the wafer spacing, wherein a ratio of the distance to the wafer spacing is larger than ½ and less than 1; and supplying a working material from the respective hole to form the films on the first top working surface and the second bottom working surface.

* * * * *